(12) United States Patent
Pinarbasi et al.

(10) Patent No.: US 6,218,056 B1
(45) Date of Patent: Apr. 17, 2001

(54) METHOD OF MAKING HIGHLY DEFINED BILAYER LIFT-OFF MASK

(75) Inventors: Mustafa Pinarbasi, Morgan Hill; Alfred Floyd Renaldo, San Jose, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/281,248

(22) Filed: Mar. 30, 1999

(51) Int. Cl.[7] ........................................ G03F 9/00
(52) U.S. Cl. ................................. 430/5; 430/296
(58) Field of Search ............................ 430/5, 296

(56) References Cited

U.S. PATENT DOCUMENTS

| | | |
|---|---|---|
| 5,227,280 * | 7/1993 | Jubinsky et al. ............ 430/312 |
| 5,318,877 * | 6/1994 | Ober et al. ................. 430/270 |
| 5,853,948 * | 12/1998 | Sawano et al. ............. 430/166 |
| 5,916,733 * | 6/1999 | Koyama ..................... 430/296 |

FOREIGN PATENT DOCUMENTS 63-197333 * 8/1988 (JP) .

* cited by examiner

*Primary Examiner*—Mark F. Huff
*Assistant Examiner*—Saleha R. Mohamedulla
(74) *Attorney, Agent, or Firm*—Gray Cary Ware & Freidenrich; Ervin F. Johnston

(57) ABSTRACT

A method makes a highly defined bilayer lift-off mask wherein lift-off mask material is subjected to an electron beam for decreasing the molecular weight of a bottom release layer and increasing the molecular weight of a top photoresist layer so that a weak developer can be employed for patterning the bottom release layer and ion milling, which is employed for removing layers not covered by the lift-off mask, does not alter a track width of the top photoresist layer.

20 Claims, 7 Drawing Sheets

(ABS)

METHOD OF MAKING HIGHLY DEFINED BILAYER LIFT-OFF MASK

BACKGROUND OF THE INVENTION

1. Field of the Invention

The present invention relates to a method of making a highly defined bilayer lift-off mask and, more particularly, to a method wherein lift-off mask material is subjected to an electron beam for decreasing the molecular weight of a bottom release layer and increasing the molecular weight of a top photoresist layer so that a weak developer can be employed for patterning the bottom release layer and ion milling does not alter a track width of the top photoresist layer.

2. Description of the Related Art

Magnetic head assemblies are typically made of multiple thin film layers which are patterned to form various shaped layers in the head. Some of the layers are plated while other layers are sputter deposited on a wafer substrate. The read head portion of a magnetic head assembly includes multiple layers that are typically sputter deposited. For example, the multiple layers of a read sensor, hard bias and lead layers connected to the sensor and first and second read gap layers below and on top of the sensor are typically sputter deposited. A prior art method of forming shaped sputter deposited layers is to sputter deposit a full film layer of the required material on a wafer substrate, form a patterned photoresist layer on the layer, ion mill away the exposed portion of the layer and then remove the photoresist layer leaving the desired shaped layer that was protected therebelow.

The aforementioned method of shaping sputter deposited layers has been generally superseded by a bilayer lift-off mask scheme which is fully explained in commonly assigned U.S. Pat. No. 5,018,037 which is incorporated by reference herein. The bilayer lift-off mask has a T-shape as seen in cross section wherein the vertical portion of the T is short and wide but less wide than the horizontal top portion of the T. The top portion of the T is generally a patterned photoresist layer and the bottom vertical portion of the T is a release layer. The configuration provides first and second undercuts as seen in cross section wherein each undercut has a height and a length below the top photoresist portion. In the aforementioned patent the bilayer lift-off mask is employed for the purpose of making contiguous junctions of the first and second lead layers with first and second side edges respectively of the read sensor. Multiple read sensor layers are sputter deposited in full film on the wafer substrate followed by formation of the bilayer lift-off mask covering a read sensor site. Ion milling is then employed to remove all of the read sensor material except that below the mask. Full films of hard bias and lead layer materials are then sputter deposited which cover the top of the lift-off mask and an area surrounding the lift-off mask. It is important that the height of the undercuts be greater than the thickness of the hard bias and lead layers. This is so a photoresist stripper can reach the bottom release layer. The stripper is then introduced which dissolves the bottom release layer causing the bilayer lift-off mask and the hard bias and lead materials deposited thereon to be released from the wafer substrate leaving the aforementioned contiguous junctions between the first and second lead layers and the first and second side edges respectively of the read sensor.

The aforementioned method prior to the aforementioned patent was not precise enough to implement contiguous junctions between the read sensor and the lead layers. Prior to the patent the lead layers overlapped the top of the read sensor and were constructed with a second photoresist mask. Since photopatterning of photoresist masks is not precise enough to align a second mask with side walls created by a first mask, the overlapping scheme was necessary. Unfortunately, this scheme caused the hard bias and lead layers to form a high profile on top of the read sensor which was replicated through subsequent layers into a write gap of the write head causing a curvature of the write gap. Write gap curvature degrades the performance of the head since the write head writes curved magnetic bits of information into the rotating disk while the read head reads the magnetic bits of information straight across. This causes a loss of signal at the outside lateral edges of the track width of the read head.

Accordingly, the bilayer lift-off mask scheme has significantly improved the making of read heads by forming contiguous junctions between the lead layers and the read sensor. Less processing steps are required and the profile of the lead and hard bias layers above the read sensor has been reduced. Unfortunately, present bilayer lift-off masks are limited to construction of read heads with a track width of greater than one micron. The more narrow the track width the greater the tracks per inch (TPI) that can be read by the read head from a rotating magnetic disk. Accordingly, the greater the tracks per inch the greater the storage capacity of a disk drive employing such a read head. Processing control of the length and height of the undercut has not been precise enough for submicron track widths. Long first and second undercuts leave insufficient release layer material which can cause the bilayer lift-off mask to be separated from the substrate or topple over during subsequent processing steps of ion milling and sputter deposition. If the undercut is too short fencing can occur which is deposition of the sputtered material across the height of the undercut preventing the photoresist stripper from reaching the underlying release layer. These problems have generally been caused by strong photoresist developers employed to pattern the release layer. Because of the rapid removal of the light exposed release layer portion by strong photoresist developers it has been difficult to precisely stop the removal of the release layer portions forming the aforementioned undercuts.

Another problem with the strong photoresist developer is that in bilayer photopatterning steps subsequent to formation of the leads the photoresist developer will attack leads made of aluminum copper (AlCu). Still another problem has been the height control of the undercuts. Still a further problem is that the strong photoresist developer attacks the top photoresist layer reducing its width. This reduction in width equates to a reduction in the track width of the read head. Typical processing of prior art bilayer lift-off masks has been to treat a single layer of photoresist with ultraviolet or an electron beam to a particular depth. Unfortunately, the penetration depth of the beam has not been precise enough to form a highly defined bottom release layer portion of a single resist layer. The height control is important since the height must be greater than the thickness of the sputter deposited material so that a photoresist stripper can reach the bottom release layer for lift-off purposes. Still a further problem with the present processing of bilayer lift-off masks is that the ion milling step reduces the width of the top photoresist layer portion. This is serious problem because this reduction reduces the track width of the read head in an uncontrolled manner.

Accordingly, there is a strong-felt need for a process of making a bilayer lift-off mask which has undercuts with precise heights and lengths, better control over a track width of the top photoresist layer portion during ion milling and provision of a photoresist developer which will not attack leads made of aluminum copper (AlCu).

SUMMARY OF THE INVENTION

In the present process the bottom release layer is a high molecular weight (>50,000 daltons) polydimethylglutarimide (PMGI) and the top layer is patterned photoresist. After forming a bottom full film layer of PMGI and a top full film layer of photoresist the top photoresist layer is light exposed in the regions that are to be removed by a photoresist developer, assuming the photoresist is a positive photoresist. A first developer, which is a relatively strong base, such as potassium hydroxide (KOH) or tetramethylammonium hydroxide (TMAH), is then employed for removing the light exposed photoresist leaving a top photoresist portion with a width which corresponds to the track width of the read head. An electron beam is then flood directed onto the top photoresist layer and the exposed portions of the release layer that are to be removed. We have found that we can control this electron beam to penetrate the top photoresist layer into the release layer portion therebelow so that the release layer is also subjected to the electron beam. The electron beam adds electrons in the molecules of the release layer material causing a breakdown of the molecular chain which is referred to in the art as scissioning. Accordingly, the electron beam scissions not only the exposed release layer material, but also the release layer material below the patterned photoresist layer. The significance of this is that the release layer material can now be removed with a weaker photoresist developer. Accordingly, a second photoresist developer that is weaker than the first developer is employed for removing the release layer material not covered by the photoresist layer as well as a portion of the release layer below the photoresist layer for forming the aforementioned undercuts. The weaker developer establishes a more precise length of the undercut. This enables read heads with narrower track widths to be constructed. Further, the height of the undercuts can be precisely controlled by the thickness of the bottom PMGI release layer. This obviates the aforementioned fencing problem. Further, the weaker developer does not attack the aluminum copper (AlCu) material of the aforementioned lead layers. Still further, it has been found that the electron beam increases the cross-linking of the molecules of the top photoresist layer. This is extremely important for preventing a reduction in the width of the top photoresist layer during ion milling which equates to improved track width control of the read head.

An object of the present invention is to provide a process for making an improved bilayer lift-off mask for making more highly defined thin film structures such as thin film structures for magnetic read and write heads.

Another object is to provide a process for making a bilayer lift-off mask wherein a strong photoresist developer is employed for removing light exposed portions of a top photoresist layer and a weak photoresist developer is employed for removing a portion of a bottom release layer.

Other objects and advantages of the invention will become more apparent to those skilled in the art after considering the following detailed description in connection with the accompanying drawings.

DESCRIPTION OF THE PREFERRED EMBODIMENTS

Magnetic Head Thin Film Components Patterned by Bilayer Lift-Off Mask

Figure 1:
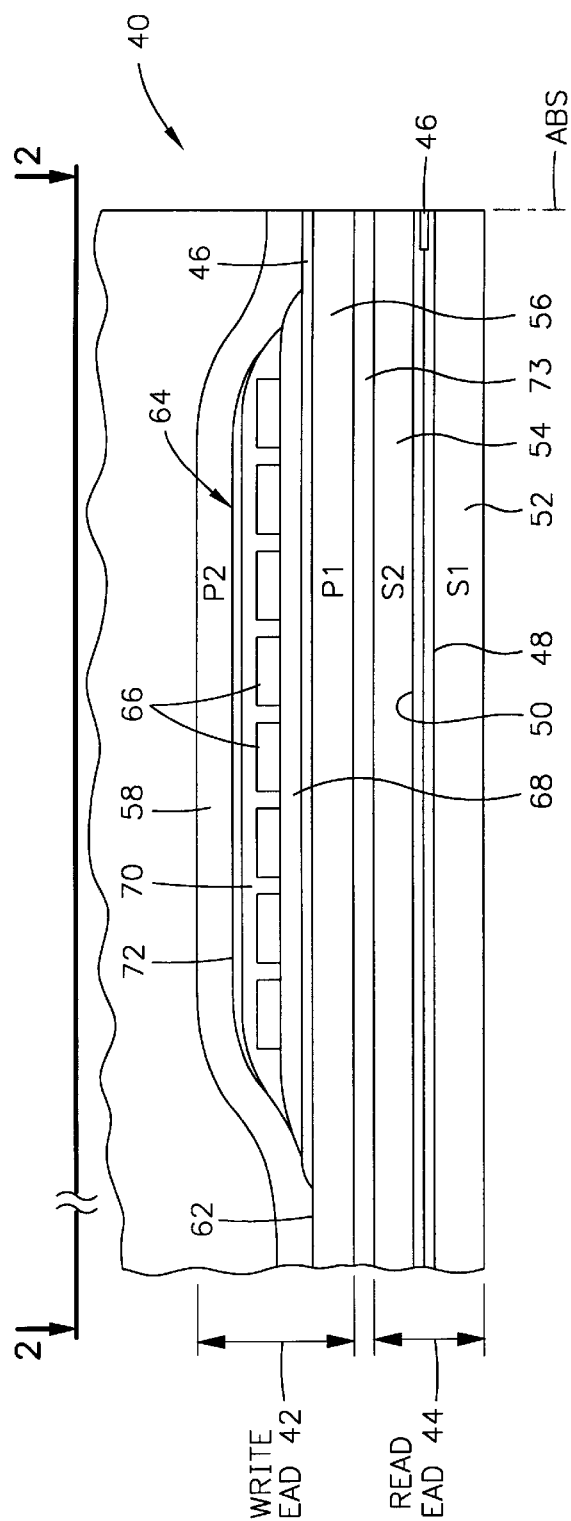
FIG. 1 is a longitudinal cross-sectional view of a portion of a magnetic head assembly including a read head and a write head.
Figure 2:
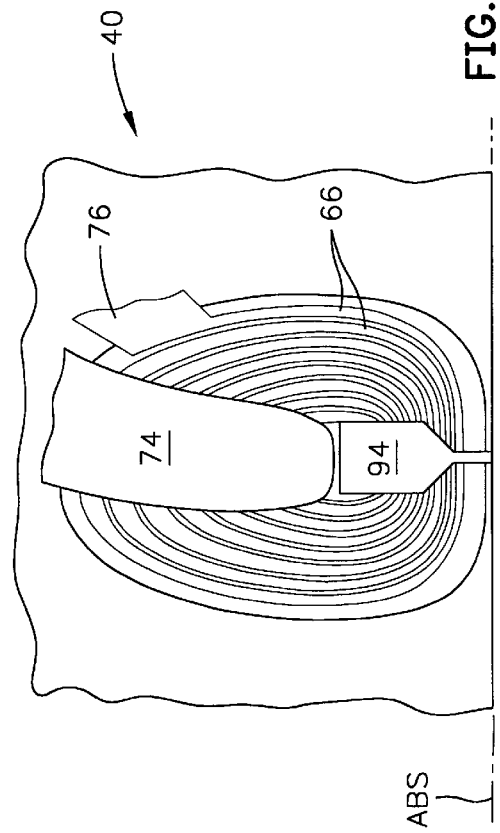
FIG. 2 is a view taken along plane 2—2 of FIG. 1 with all layers above the first insulation layer of the insulation stack removed except the coil layer, first and second leads for the coil layer and a second pole piece layer.

FIG. 1 shows a magnetic head assembly 40 which has a write head portion 42 and a read head portion 44. The read head portion includes a multilayered read sensor 46 which is located between nonmagnetic electrically insulative first and second read gap layers 48 and 50. First and second lead layers, which will be described in more detail hereinafter, are connected to first and second side edges of the read sensor 46. The read sensor 46 and the first and second lead layers are located between nonmagnetic electrically insulative first and second read gap layers 48 and 50. In a merged magnetic head assembly the second shield layer 54 also serves as a first pole piece layer 56 of the write head. The write head includes first and second pole piece layers 56 and 58 wherein the second pole piece layer is separated from the first pole piece layer 56 by a nonmagnetic write gap layer 60 in the pole tip region and is connected to the first pole piece layer at a back gap 62 in a back gap region. Between the pole tip and back gap regions is a yoke region where an insulation stack 64 is located between the first and second pole piece layers 56 and 58. Embedded within the insulation stack 64 is a pancake-shaped coil 66 which is located between first and second insulation layers 68 and 70 of the insulation stack and is capped by a third insulation layer 72 to smooth out ripples caused by the coil layer 66. The first pole piece layer 56 is separated from the second shield layer 54 by a nonmagnetic layer 73. Since the first pole piece layer 56 is separated from the second shield layer 54 this type of head is known in the art as a piggyback head. When the first pole piece layer 56 and the second shield layer are a common layer this is known in the art as a merged head. FIG. 2 is a top view of FIG. 1 which is extended to show the back portion of the write coil 66 with first and second leads 74 and 76 that are connected to the coil layer and that provide a write current thereto.

Figure 3:
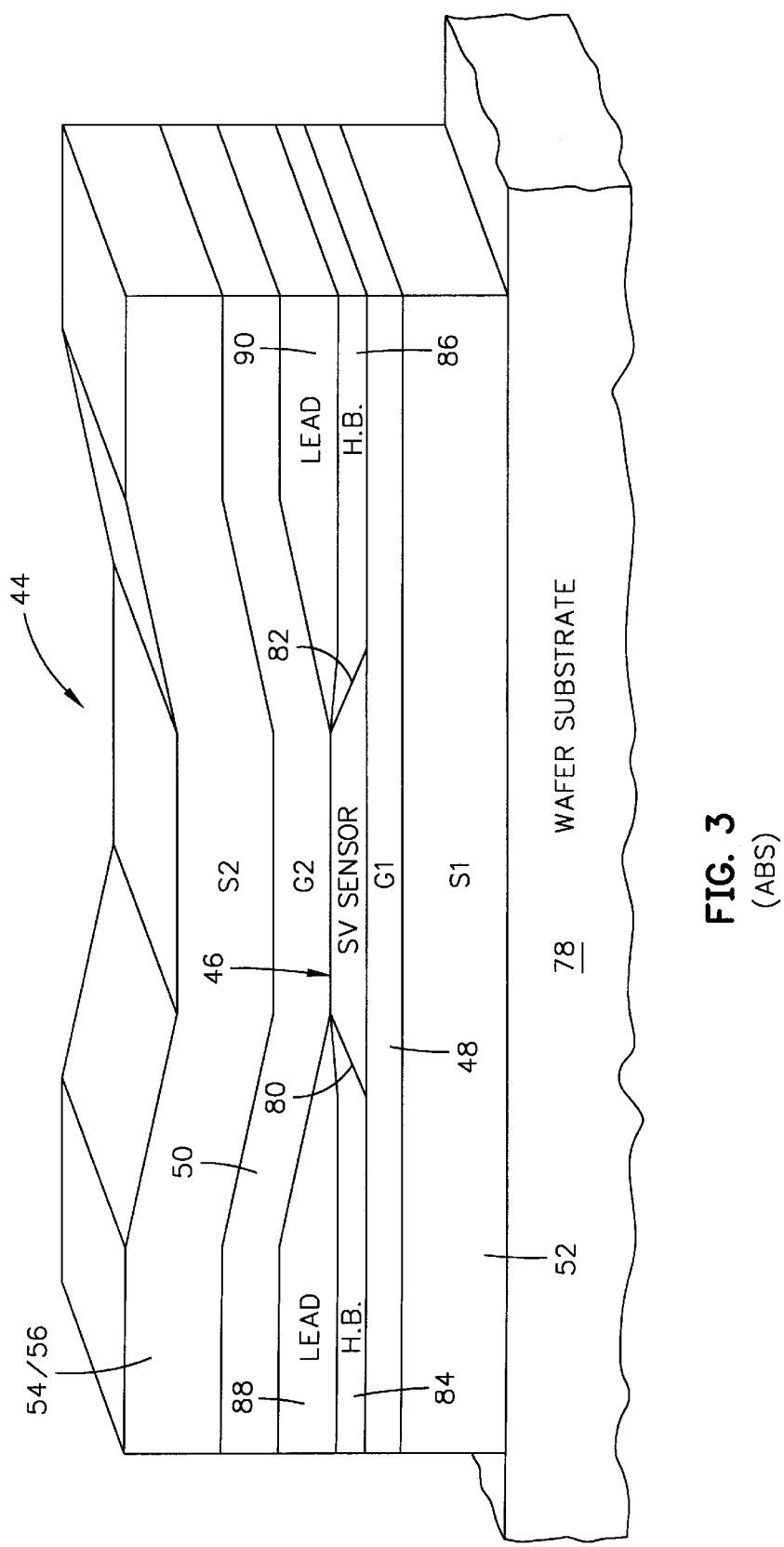
FIG. 3 is an ABS isometric schematic illustration of the read head portion of the magnetic head assembly of FIG. 1.

FIG. 3 is an enlarged isometric ABS illustration of the read head portion 44 of the magnetic head assembly in FIG. 1. It is constructed on a wafer substrate 78. The multilayered sensor 46 has first and second side edges 80 and 82 that are connected to first and second hard bias layers (HB) 84 and 86 and first and second lead layers 88 and 90. This type of connection is known in the art as a contiguous junction which is fully described in the aforementioned U.S. Pat. No. 5,018,037. This type of junction is typically formed by a bilayer lift-off mask with process steps shown in FIGS. 4–7.

Process Steps for Making Contiguous Junction

Figure 4:
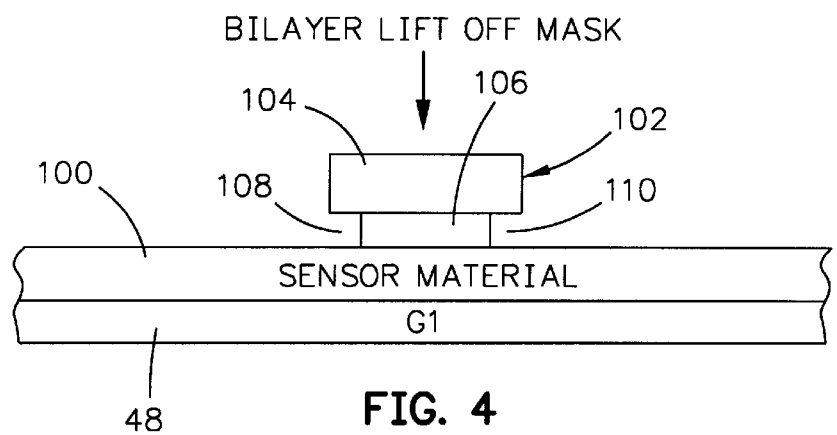
FIG. 4 is an ABS illustration of the first step in forming a bilayer lift-off mask on top of multiple sputtered thin films of sensor material.
Figure 5:
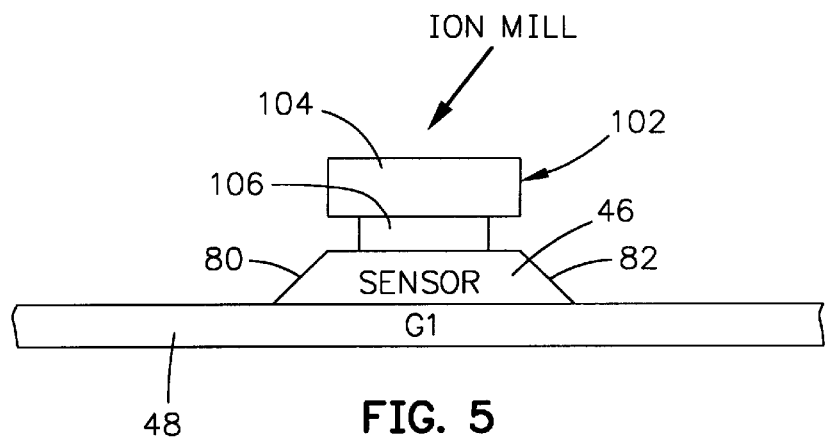
FIG. 5 is the same as FIG. 4 except ion milling has been employed to remove exposed portions of sensor material about the mask.
Figure 6:
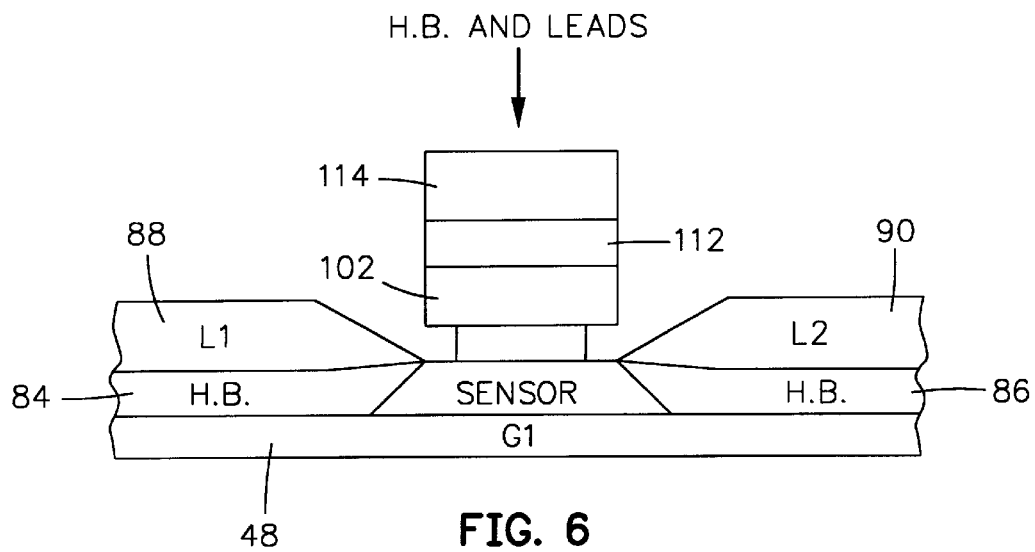
FIG. 6 is the same as FIG. 5 except first and second hard bias and lead layers have been sputter deposited over the entire wafer as well as on top of the mask.
Figure 7:
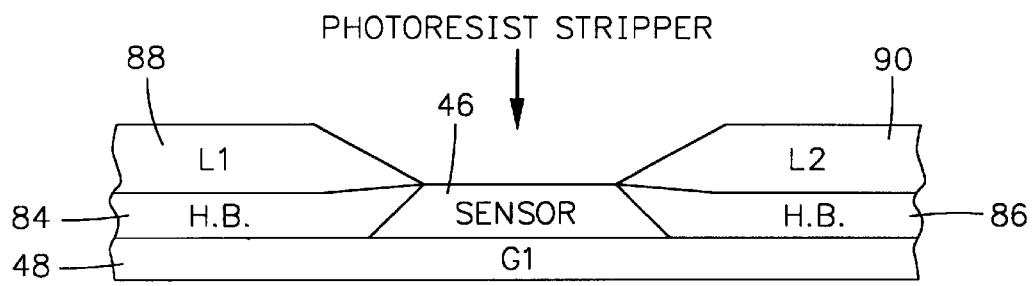
FIG. 7 is the same as FIG. 6 except the mask has been removed with a stripper which also removes the material sputter deposited on top of the mask.

FIG. 4 illustrates the first steps in the making of a contiguous junction between the read sensor and first and second hard bias and lead layers. After sputter depositing multilayers of sensor material 100 on the first gap layer 48, a bilayer lift-off mask 102 is formed on top of the sensor material layer in a region where the read sensor is to be formed. The bilayer lift-off mask 102 includes a top photoresist layer 104 on top of a bottom release layer 106. The release layer 106 has first and second side edges which are recessed below the top photoresist layer to provide first and second undercuts 108 and 110 below the top photoresist layer. In FIG. 5 ion milling is employed to remove all of the sensor material layer except for a portion of the sensor material layer below the bilayer lift-off mask 102 so as to form the read sensor 46 with first and second side edges 80 and 82. The first and second side edges 80 and 82 slope outwardly because of the angle of the ion milling and the shadowing effect of the bilayer lift-off mask 102. In FIG. 6 a full film of hard bias material is sputter deposited followed by sputter deposition of a full film of lead material 88 and 90. Because of the full film sputter deposition a portion of the hard bias material layer 112 and a portion of the lead material layer 114 is formed on top of the bilayer lift-off mask 102. In FIG. 7 the wafer is subjected to a photoresist stripper which dissolves the bottom release layer 106 and releases the bilayer lift-off mask 102 with the layers 112 and 114 thereon so as to form contiguous junctions between the first and second side edges 80 and 82 of the read sensor and the hard bias layers 84 and 86 and the first and second lead layers 88 and 90. This process is essentially described in the aforementioned patent.

In a prior art process of forming the bilayer lift-off mask 102 in FIG. 4 a strong photoresist developer is employed for removing exposed portions of the release layer 106 to form the configuration shown in FIG. 4. This results in poor process control of the length of the undercuts 108 and 110 below the top photoresist layer 104. Because of this lack of process control it is difficult to form sensors 46 with submicron track widths. Further, there is a lack of control in the height of the undercuts 108 and 110 which can cause fencing of the sputtered hard bias and lead layer materials causing a closure of the openings to the undercuts 108 and 110 so as to prevent a photoresist stripper from dissolving the release layer 106 for lift-off purposes. Another problem with the present process is that during the ion milling step in FIG. 5 the width between the side edges of the top photoresist layer 104 are ion milled away to reduce this width which equates to an unpredictable track width of the sensor 46. Further, when the developer is employed in subsequent bilayer photoresist steps it can attack and erode the first and second lead layers 88 and 90 if the lead layers are made of materials such as aluminum copper (AlCu).

Present Process of Making Bilayer Lift-Off Mask

Figure 8:
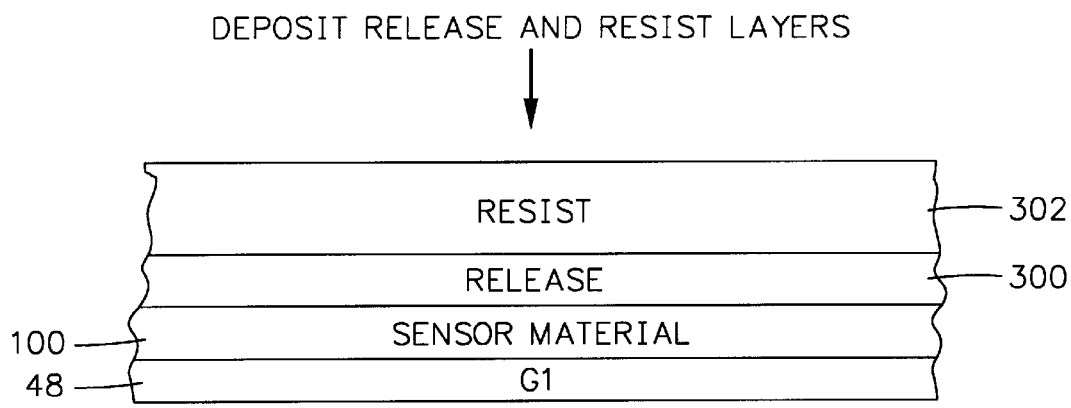
FIG. 8 is a cross-sectional elevation view of a first step in the process of making the present bilayer lift-off mask which comprises the steps of sputter depositing a bottom release layer and a top photoresist layer.
Figure 9:
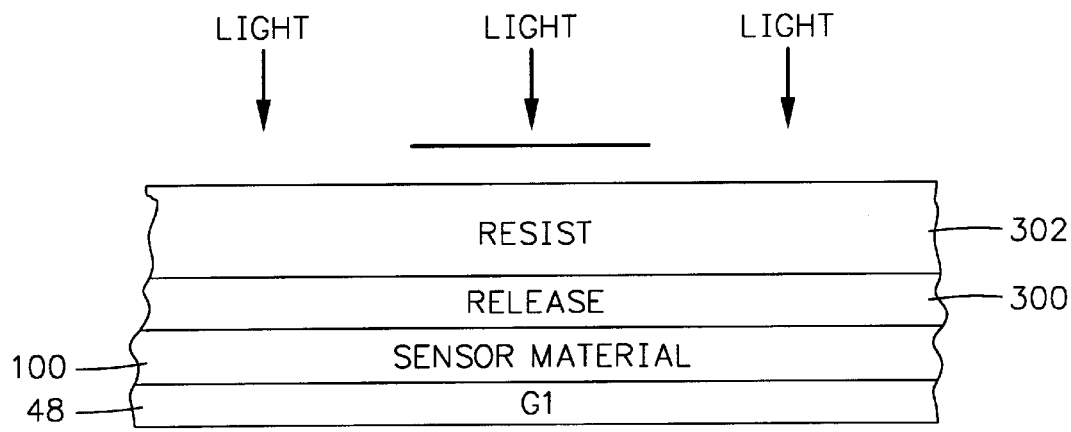
FIG. 9 is the same as FIG. 8 except the top photoresist layer has been light exposed in regions that are to be removed by a strong developer.
Figure 10:
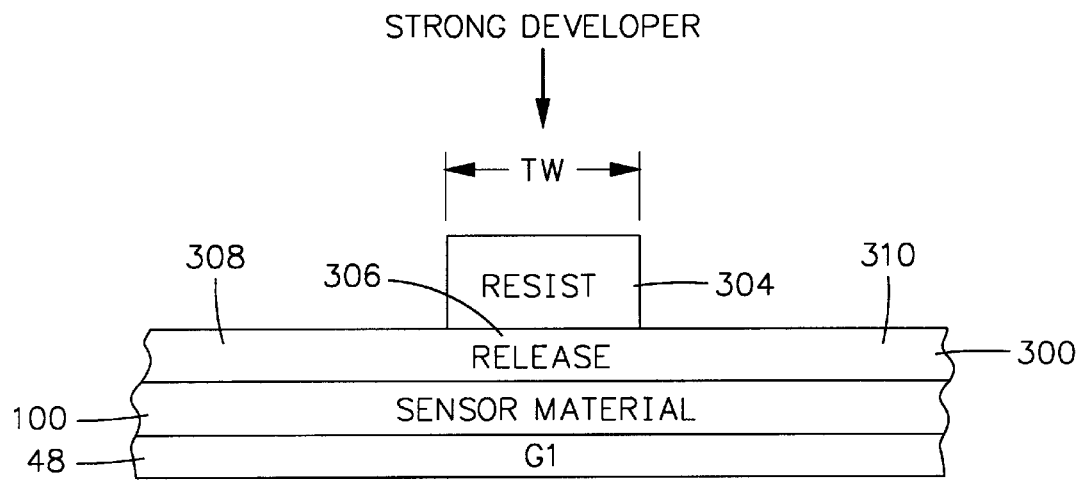
FIG. 10 is the same as FIG. 9 except the light exposed portions of the photoresist layer have been removed by the strong developer.

The present process of making the present bilayer lift-off mask and steps in its implementation are illustrated in FIGS. 8–15. As shown in FIG. 8, after sputter depositing a full film of multi-thin film sensor material layers 100 a bottom release layer 300 is formed on the sensor material layer 100. The bottom release layer 300, which may be spun on the wafer, is polydimethylglutarimide (PMGI). A top photoresist layer 302 is then spun on top of the release layer 300 which may be a polyphenolic polymer or polyvinylphenol. A polyphenolic polymer is also known commercially as Novolak which can be purchased from Hoechst Celanese, Sumitomo, or Shipley. The molecular weight of the PMGI can range from 20,000 to 120,000 daltons. A polyphenolic polymer is a copolymer of phenol and formaldehyde. The PMGI is also commercially known as SAL-110 or LOL-1000 when purchased from Shipley. The difference between SAL-110 and LOL-1000 is its molecular weight (Mw). The Mw of SAL-110 is 110,000 daltons and the Mw of LOL-1000 is approximately 20,000 daltons. In FIG. 9 the photoresist is light exposed in regions which are to be removed provided the photoresist is a positive photoresist. If the photoresist is a negative photoresist it is light exposed in the regions that are to be retained. In FIG. 10 the layers are subjected to a strong potassium hydroxide (KOH) developer, such as 1:6 2401 (Shipley) or 1:4 AZ 400 K (Hoechst Celanese) wherein the ratios are the developer to water. In a 1:6 2401 developer the develop time can be up to 3 minutes for the purpose of removing light exposed photoresist portions leaving a photopatterned top resist layer 304 overlying a bottom portion of the release layer and leaving portions of the release layer beyond the top resist layer 304 exposed, as shown in FIG. 10.

Figure 11:
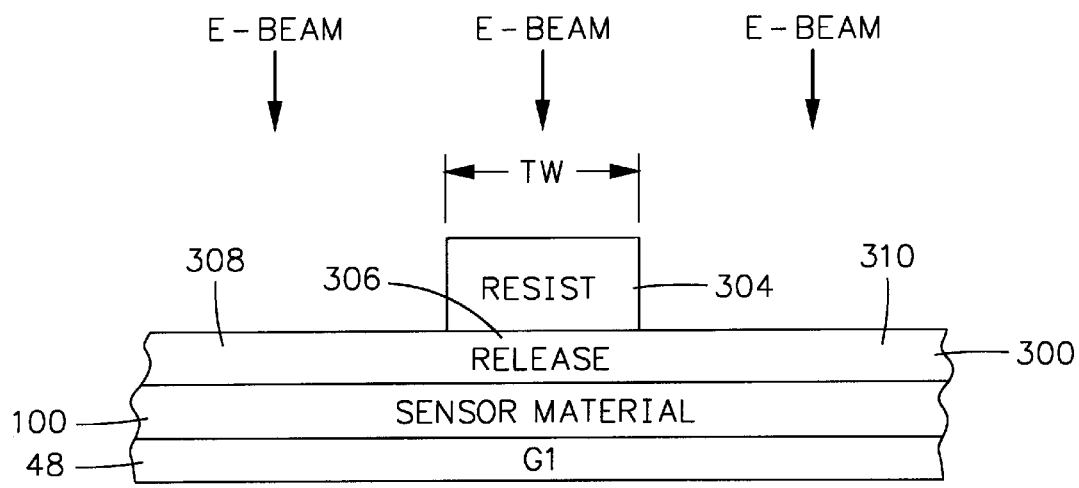
FIG. 11 is the same as FIG. 10 except a flood E-beam has been directed onto the wafer substrate penetrating the uncovered portions of the bottom release layer as well as a portion of the bottom release layer below the top photoresist layer.

In FIG. 10 the layers are subjected to a flood electron beam from an electron beam gun. The electron beam gun is fully described in U.S. Pat. No. 5,003,178, which can be purchased from Allied Signal. The electron beam penetrates the first and second exposed portions 308 and 310 of the release layer and penetrates through the top photoresist layer 304 into the bottom release layer portion 306. A suitable flood electron beam is between 50 to 250 micro-coulombs ($\mu$C) at 2–7 kilo electron volts (KeV). The result of the E-beam treatment in FIG. 11 is that the bottom release layer portion 306 and the first and second exposed release layer portions and 308 and 310 are scissioned. Scissioning partially separates the molecules of the PMGI polymer which is known in the art as unzipping the PMGI polymer. The E-beam treatment causes the PMGI polymer to have a lower molecular weight which allows a faster dissolution of the PMGI material and sets the stage for the use of a weaker developer for patterning the bottom release layer 306.

Figure 12:
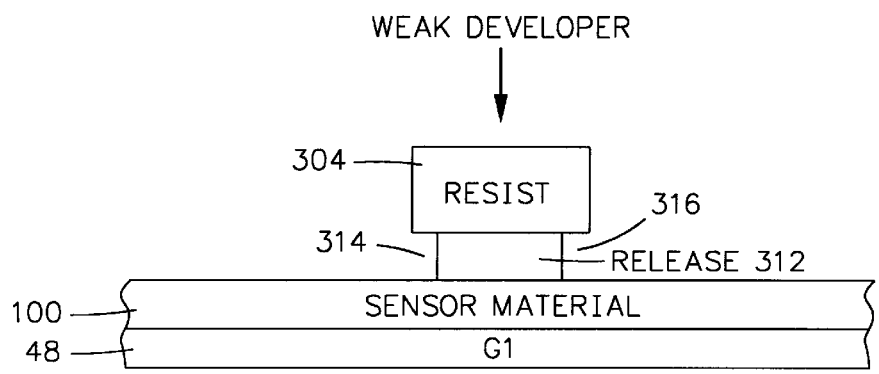
FIG. 12 is the same as FIG. 11 except a weak developer has been employed for removing the uncovered portion of the bottom release layer as well as undercut portions of the bottom release layer portion below the photoresist layer.

In FIG. 12 the aforementioned weaker photoresist developer is employed for removing the first and second exposed portions 308 and 310 of the release layer in FIG. 11 and removing first and second portions of the release layer below the top resist layer 304 to form a patterned bottom release layer 312 that is recessed from the first and second side edges 318 and 320 of a top resist layer to form first and second undercuts 314 and 316. (See FIG. 12). The weaker developer may be an AZ type commercially known as AZ developer and may be purchased from Hoechst Celanese. This weaker developer consists of sodium hydroxide buffered with a phosphoric acid, trisodium salt and silicic acid, sodium salt. It should be noted that the thickness of the release layer 300 in FIG. 9 is maintained in the patterned bottom release layer 312 in FIG. 12 so as to precisely define the height of the first and second undercuts 314 and 316. The length of the undercut can be precisely controlled by the amount of time that the weak developer is left in place to remove release layer portions below the top photoresist layer 304.

Figure 13:
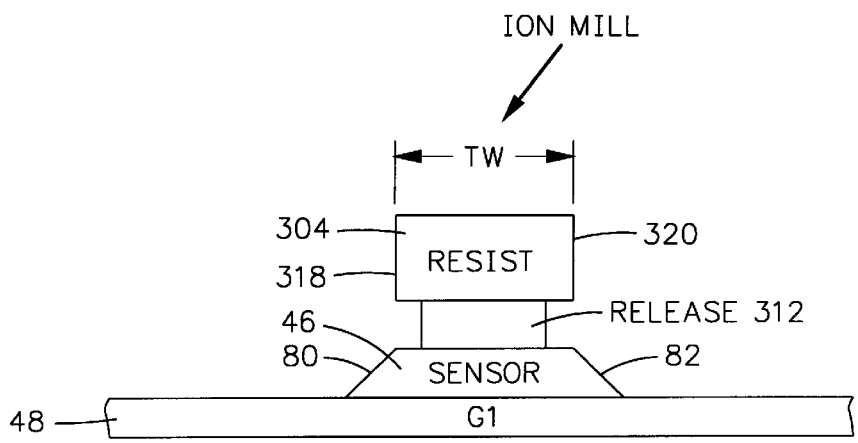
FIG. 13 is the same as FIG. 12 except side edges of the sensor have been formed by ion milling away exposed portions of the sensor material layer.

We have found that the E-beam treatment in FIG. 11 worked an opposite result on the top photoresist layer 304, namely the molecules of the top photoresist layer 304 were cross-linked making its molecular weight higher. This was a significant advantage for the next step. In FIG. 13 ion milling was employed to remove all portions of the sensor material layer except for the sensor 46 with the first and second sloping side edges 80 and 82. Because of cross-linking of the polymer of the top photoresist layer 304 by the E-beam treatment in FIG. 11, the top photoresist layer is highly resistant to the ion milling step in FIG. 13. Accordingly, the locations of the first and second side edges 318 and 320 of the top photoresist layer were not altered by the ion milling which preserved a desired track width for the sensor 46.

Figure 14:
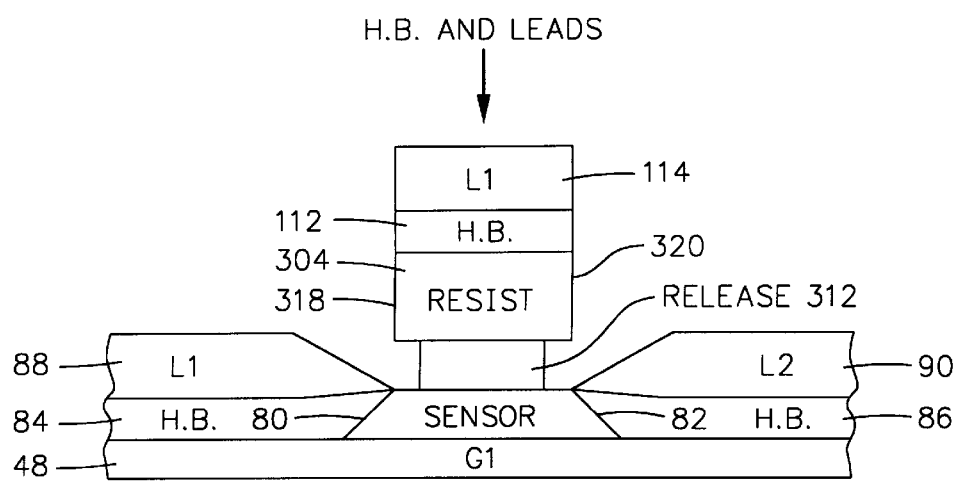
FIG. 14 is the same as FIG. 13 except hard bias and lead layers have been sputter deposited over the entire wafer as well as on top of the top photoresist layer.

In FIG. 14 hard bias and lead layers are sputter deposited to form the first and second hard bias layers 84 and 86 and the first and second lead layers 88 and 90. These layers make contiguous junctions with the first and second side edges 80 and 82 of the sensor. This also forms hard bias layer portion 112 and lead layer portion 114 on top of the top photoresist layer 320.

Figure 15:
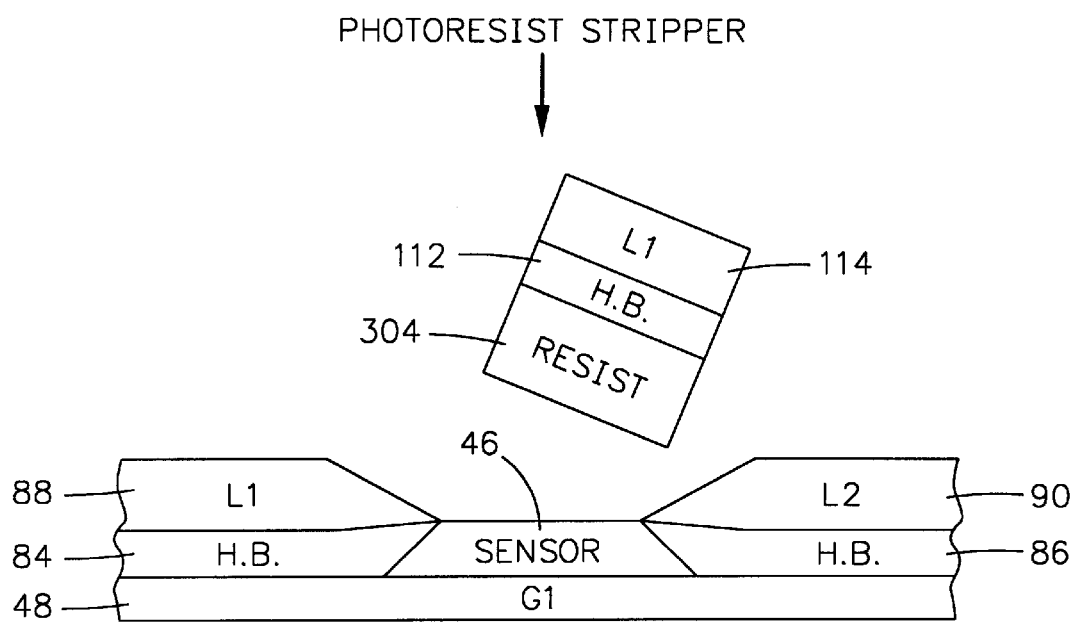
FIG. 15 is the same as FIG. 14 except a stripper has been employed to dissolve the bottom release layer to release the bilayer lift-off mask from the wafer along with the layers sputter deposited thereon.

In FIG. 15 the wafer substrate may be subjected to a photoresist stripper for dissolving the bottom release layer 312 and releasing the top photoresist layer 320 along with the sputtered layers 112 and 114 thereon from the wafer substrate. An exemplary photoresist stripper for the release layer is N-methyl pyrrolidone (NMP). It should be noted that such a photoresist stripper will not attack the lead layers 88 and 90 if they are made of a material such as aluminum copper (AlCu). The sensor 46, the first and second hard bias layers 84 and 86 and the first and second lead layers 88 and 90 formed in FIG. 15 are the same as the sensor, first and second hard bias layers and first and second lead layers in FIG. 3.

Figure 16A:
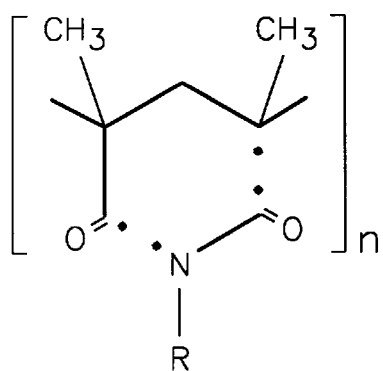
FIG. 16A is an exemplary molecular chain of the bottom release layer before scissioning with the E-beam.
Figure 16B:
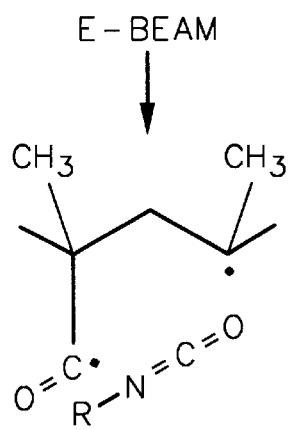
FIG. 16B is the same as FIG. 16A except the molecular chain has been broken by scissioning with the E-beam.

FIG. 16A shows an exemplary molecular chain of PMGI before scissioning. Without scissioning this material would need a stronger developer to implement removal. FIG. 16B illustrates a molecular chain of the PMGI after being subjected to an electron beam. It can be seen that there has been a division or unzipping of the molecular chain which lowers the molecular weight of the PMGI and permits faster removal of the PMGI with a weaker developer. Chart 1 shows PMGI dissolution rates with a Shipley 2401 developer after electron beam exposure. The 2401 developer is a high strength potassium hydroxide (KOH) with nonionic surfactants. The PMGI was SAL-110 cured at 160° C. for 1 hour.

Chart 1
(PMGI only @ 2 KeV electron voltage)

| Exposure | Time | Dissolution Rate |
|---|---|---|
| $\mu$C cm-2 | 940 sec | 12 Å/sec |
| 50 $\mu$C cm-2 | 10 sec | 82 Å/sec |
| 100 $\mu$C cm-2 | 5 sec | 162 Å/sec |
| 400 $\mu$C cm-2 | 5 sec | 160 Å/sec |
| 1000 $\mu$C cm-2 | 300 sec | 0 Å/sec |

It can be seen from Chart 1 that the dissolution rate of PMGI increases with an increase in the exposure to the E-beam. However, when the exposure becomes too high the molecular chain of PMGI recombines to slow down and ultimately terminate the dissolution rate.

Chart 2 sets forth various development times to create various undercuts of the bottom release layer when the bottom release layer is PMGI. The PMGI was LOL-1000 and was baked at 160° C. for 1 hour. The second resist was SJR 3138 by Shipley and was baked at 105° C. for 20 minutes. The bilayer was exposed to actinic radiation (mercury lamp) and treated with the first developer (AZ2401 1:6) for 2 minutes. The layers were subsequently exposed to an E-beam dose of 250 $\mu$C per square centimeter ($cm^2$) at an accelerating voltage (2–7 KeV). The layers were then developed with the second weaker KOH developer (AZ 400K 1:5) for times indicated.

Chart 2

| Develop Time | Undercut/Edge |
|---|---|
| 45 sec | 0.54 $\mu$m |
| 60 sec | 0.69 $\mu$m |
| 90 sec | 0.72 $\mu$m |
| 120 sec | 0.77 $\mu$m |

Chart 3 hereinbelow shows results from testing the etch rate of aluminum copper (AlCu) when subjected to various photoresist developers (second developer described hereinabove).

Chart 3

| Developer | Etch Rate of AlCu (no resists present) |
|---|---|
| Shipley 2401 1:6 | 3 Å/sec |
| MP 454 | 54 Å/min |
| MP 354/AZ 1:1 | 14 Å/min |
| AZ 400K 1:4 | 55 Å/min |
| AZ/$H_2$O 1:1 | 8 Å/min |
| AZ/$H_2$O 1:2 | 10 Å/min |

Based upon Chart 3 the best candidates were AZ/$H_2$O 1:1, AZ/$H_2$O 1:2 and MP 354/AZ 1:1.

EXAMPLE

A wafer with sputtered AlCu was coated with SAL-110 (120,000 Mw) and baked (160° C. 1 hour in hot plate oven) to give a film thickness of approximately 1000 Å. The top imaging resist (SJR 3138, Shipley positive Novolak photoresist) was coated and soft-baked (95° for 20 minutes hot plate oven) to give a 1.0 $\mu$m thick film. The bilayer resists were exposed to actinic radiation (mercury lamp) and treated with strong first developer (AZ2401 1:6) for 2–3 minutes to remove the light-treated portion of the top imaging resist. The SAL-110 does not efficiently develop in AZ2401 1:6.

The partially developed bilayer was subsequently treated with an electron beam tool (Allied Signal) using a flood electron beam dose of 10–200 $\mu$C $cm^{-2}$ (total 260 PC $cm^{-2}$) with varying electron acceleration voltages to insure complete penetration of the bilayer film thickness (2–7 KeV for a 1:1 $\mu$m total film thickness).

The E-beam exposed bilayer was treated with a weaker second developer AZ 1:2 for 2–3 minutes to give a slight undercut. It was found that there was no appreciable attack of the AlCu by the AZ 1:1 developer. This is important in bilayer photoresist steps subsequent to the formation of the lead layers 88 and 90 in FIG. 14. As an example, after the bilayer photoresist is released in FIG. 15 a second bilayer photoresist is formed on the wafer for defining the stripe height of the sensor 46. When the second developer is used for defining the release layer 312 in FIG. 12 it is important that this developer not attack leads 88 and 90 (see FIG. 15) made of AlCu. A weak first developer, as described hereinabove, is required. The first developer may be potassium hydroxide or TMAH, such as KOH/H$_2$O in a ratio of 1:4 or 1:3.5 or TMAH/H$_2$O at 2.38% by weight and the second developer having a AZ/H$_2$O ratio of 1:1 or 1:2.

Pertinent references regarding the PMGI layer, the photoresist layers, developers and E-beam treatment are pages 56, 57, 96–98 and 117–135 of "Semiconductor Lithography Principles, Practices and Materials" by Wayne M. Moreau, published by Plenum Press 1989. Another reference is "Introduction to Microlithography" Second Edition edited by Larry F. Thompson, C. Grant Willson and Murrae J. Bowden, an ACS publication in 1994 published by the American Chemical Society, Washington, D.C.

A description of a PMGI process for MR heads is set forth in U.S. Pat. No. 5,604,073. An example of a controlled E-beam dose for difference in resist solubility for a single layer resist is set forth in U.S. Pat. No. 5,468,595. An example of an E-beam and lift-off process (MR) in a single layer resist is set forth in U.S. Pat. No. 5,658,469. An example of a PMGI lift-off bilayer resist with UV treatment and heating is set forth in U.S. Pat. No. 5,360,698. A patent showing E-beam to increase cross-link density of novolak resist is U.S. Pat. No. 5,843,537. The above patents and articles are incorporated by reference herein.

It should be understood that when the aluminum copper (Al/Cu) leads are not an issue and the only issue is a controlled undercut that both developers may be KOH with the strong KOH developer having a concentration of 1:3 (normality of 0.12) or stronger and the weak KOH developer having a concentration of 1:4 (normality of 0.096) or weaker. A similar relationship can be used with TMAH wherein a strong TMAH developer can be 2.38% of TMAH by weight in water and the weak TMAH developer can be 1.2% of TMAH by weight in water or weaker.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A method of making a bilayer lift-off mask comprising:
   providing a substrate;
   forming a bottom release layer on the substrate;
   forming a top photoresist layer on the release layer;
   light exposing the top photoresist layer for patterning the top photoresist layer;
   developing the top photoresist layer with a first developer to form a patterned top photoresist layer that covers a first portion of the bottom release layer and leaves a second portion of the bottom release layer exposed;
   after light exposing and developing the top photoresist layer directing an electron beam into the exposed second portion of the bottom release layer and into and through the patterned top photoresist layer into the first portion of the bottom release layer for scissioning the first and second portions of the bottom release layer;
   developing the first and second portions of the bottom release layer with a second developer for removing the second portion of the release layer and lateral portions of the first portion of the release layer under the patterned top photoresist layer so as to provide undercut portions below the patterned top photoresist layer; and
   the second developer being a weaker developer than the first developer.

2. A method as claimed in claim 1 wherein the bottom release layer is polydimethylglutarimide (PMGI).

3. A method as claimed in claim 2 wherein the top photoresist layer is a polyphenolic polymer.

4. A method as claimed in claim 3 wherein a thickness of the top photoresist layer is in a range of 0.5 to 1.2 μm and a thickness of the bottom release layer is in a range of 800 to 1500 Å.

5. A method as claimed in claim 4 wherein an exposure to the electron beam is 10 to 250 μC cm$^{-2}$ with an energy of 2–7 KeV.

6. A method as claimed in claim 5 wherein the first developer is potassium hydroxide (KOH) or TMAH.

7. A method as claimed in claim 6 wherein the second developer is a weaker TMAH or is sodium hydroxide or potassium hydroxide buffered with phosphoric acid, trisodium salt, silicic acid and sodium salt.

8. A method as claimed in claim 1 wherein the patterned top photoresist layer is also scissioned by the electron beam.

9. A method as claimed in claim 1 wherein the patterned top resist layer is hardened by the electron beam to ion milling or reactive ion etching.

10. A method as claimed in claim 1 wherein a resistance of the patterned top photoresist layer to the second developer is increased by the electron beam and a resistance of the first and second portions of the bottom release layer to the second developer is decreased by the electron beam.

11. A method as claimed in claim 1 wherein the electron beam increases a molecular weight of the patterned top photoresist layer and decreases a molecular weight of the first and second portions of the bottom release layer.

12. A method as claimed in claim 11 wherein the patterned top photoresist layer is also scissioned by the electron beam.

13. A method as claimed in claim 12 wherein the patterned top resist layer is hardened by the electron beam to ion milling or reactive ion etching.

14. A method as claimed in claim 13 wherein a resistance of the patterned top photoresist layer to the second developer is increased by the electron beam and a resistance of the first and second portions of the bottom release layer to the second developer is decreased by the electron beam.

15. A method as claimed in claim 14 wherein the bottom release layer is polydimethylglutarimide (PMGI).

16. A method as claimed in claim 15 wherein the top photoresist layer is a polyphenolic polymer.

17. A method as claimed in claim 16 wherein a thickness of the top photoresist layer is in a range of 0.5 to 1.2 μm and a thickness of the bottom release layer is in a range of 800 to 1500 Å.

18. A method as claimed in claim 17 wherein an exposure to the electron beam is 10 to 250 μC cm$^{-2}$ with an energy of 2–7 KeV.

19. A method as claimed in claim 18 wherein the first developer is potassium hydroxide (KOH) or TMAH.

20. A method as claimed in claim 19 wherein the second developer is a weaker TMAH or is sodium hydroxide or potassium hydroxide buffered with phosphoric acid, trisodium salt, silicic acid and sodium salt.

* * * * *